(12) United States Patent
Kaushik et al.

(10) Patent No.: US 6,518,634 B1
(45) Date of Patent: Feb. 11, 2003

(54) STRONTIUM NITRIDE OR STRONTIUM OXYNITRIDE GATE DIELECTRIC

(75) Inventors: Vidya S. Kaushik, Austin, TX (US); Bich-Yen Nguyen, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/654,704

(22) Filed: Sep. 1, 2000

(51) Int. Cl.$^7$ .................. H01L 29/76; H01L 27/108
(52) U.S. Cl. ................ 257/406; 257/410; 257/411; 257/310; 438/216; 438/261; 438/287
(58) Field of Search ................ 257/406, 410, 257/411, 310; 438/216, 261, 287, 288

(56) References Cited

FOREIGN PATENT DOCUMENTS

EP     1011149 A2  *  6/2000

OTHER PUBLICATIONS

Jean Gaude et al.: ":Le systeme strontium–azote. II. Sur une nouvelle combinaison du strontium et de l'azote;" Revue de Chimie Mineral, t. 8, 1971, pp. 287–299; Manuscrit recu le 30 Nov. 1970.

* cited by examiner

Primary Examiner—Tom Thomas
Assistant Examiner—Donghee Kang
(74) Attorney, Agent, or Firm—James L. Clingan, Jr.

(57) ABSTRACT

A method of forming a capacitor and transistor are disclosed. Initially, a substrate having a semiconductor material on a first surface is provided. A layer of strontium nitride is then deposited over the first surface and a gate electrode formed over the strontium nitride. Source and drains are then formed in the first surface disposed laterally adjacent to the gate electrode to leave a channel under the gate electrode. A dielectric layer may be formed over the layer of strontium nitride prior to forming the gate electrode. The dielectric layer may include strontium, titanium, and oxygen. In one embodiment, the dielectric layer and the layer of strontium nitride are epitaxial layers. In another embodiment the layer of strontium nitride is formed by sputtering, chemical vapor deposition (CVD), or atomic layer deposition (ALD). The dielectric layer may include strontium, oxygen, and nitrogen, such as strontium oxynitride formed by sputtering, CVD, or ALD.

8 Claims, 2 Drawing Sheets

STRONTIUM NITRIDE OR STRONTIUM OXYNITRIDE GATE DIELECTRIC

FIELD OF THE INVENTION

The present invention is related to the field of semiconductor fabrication and more particularly to a semiconductor device with a strontium nitride or strontium oxynitride gate dielectric and an associated process for forming the device.

RELATED ART

In the field of semiconductor fabrication, the use of dielectric materials with a high dielectric constant (high K materials) is well known. High K materials enable the use of thicker dielectric layers in MOS transistors while maintaining the required capacitance. A thicker dielectric layer is typically desirable to reduce gate leakage current thereby reducing the power consumption of the device. In many applications, such as wireless applications, the power consumption is a significant constraint on the ability to prolong the operation/standby time of a portable device.

The use of strontium as an element in a high K material has been typically limited to strontium titanate (SrTiO3), also referred to as STO. Typically, STO is formed with a molecular beam epitaxy process. Because of a mismatch between the STO lattice constant and the lattice constant of the underlying silicon substrate, it is typically necessary to include a buffer or template layer between the STO and the silicon. A conventional template layer for epitaxial STO processes is strontium oxide (SrO). Unfortunately, the use of an oxygen bearing template layer undesirably results in the formation of silicon dioxide at the upper surface of the silicon substrate. The lower dielectric constant of the silicon dioxide undesirably increases the effective oxide thickness (EOT) of the dielectric stack. In addition, epitaxial STO deposition rates are typically less than one monolayer per minute. To form a sufficiently thick epitaxial STO layer typically requires in the range of approximately 30 minutes to 60 minutes per wafer. The throughput restraints imposed by such a process are prohibitive in most manufacturing environments. It would therefore be desirable to implement a gate dielectric process utilizing strontium that did not include an epitaxial process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
FIG. 1 is a partial cross-sectional view of a semiconductor substrate on which a buffer layer according to one embodiment of the invention has been formed.

Turning now to the drawings, FIGS. 1 through 4 illustrate a method of fabricating a semiconductor device with a dual layer, strontium bearing gate dielectric according to one embodiment of the invention. In FIG. 1, a buffer layer 104 is deposited on a first surface 101 of a substrate 102 of a wafer 100. Typically, an upper portion of substrate 102 including first surface 101 comprises a semiconductor material. In one embodiment, substrate 102 comprises a 100 oriented, single crystal silicon lattice. Buffer layer 104 may comprise strontium nitride (SrN) formed on upper surface 101 of substrate 102. In another embodiment suitable for use with an epitaxial TSO layer, buffer layer 104 may comprise an epitaxial SrN layer. The epitaxial SrN layer may be formed with an MBE process in which solid phase strontium is evaporated with a high energy beam to form a vapor phase strontium which is then flowed into a nitrogen bearing chamber in which wafer 100 is located. In non-epitaxial embodiments, buffer layer 104 may be formed by alternative deposition methods including sputtering, chemical vapor deposition (CVD), and atomic layer deposition (ALD). In a suitable sputtering process, a strontium target is bombarded with high energy particles thereby releasing strontium into a nitrogen containing chamber in which wafer 100 is located. The sputtering process may be a plasma assisted process.

Figure 2:
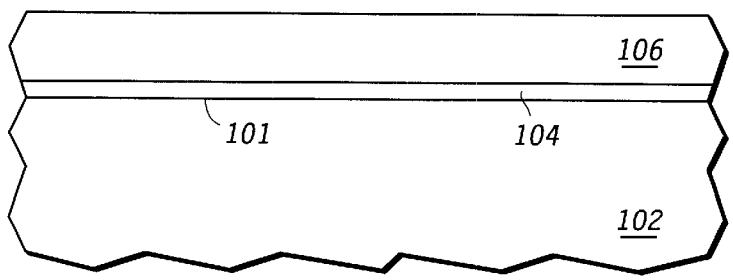
FIG. 2 illustrates a processing step subsequent to FIG. 1 in which a gate dielectric layer has been formed.

Turning now to FIG. 2, a dielectric layer 106 may be formed over buffer layer 104. In one embodiment, dielectric layer 106 includes strontium, titanium, and oxygen. In this embodiment, dielectric layer 106 may comprise strontium titanate (SrTiO3). In an embodiment in which buffer layer 104 comprises epitaxial strontium nitrate, gate dielectric layer 106 typically comprises epitaxial STO formed with a molecular beam epitaxial process. In a non-epitaxial embodiment, dielectric layer 106 may be deposited with alternative deposition techniques including sputtering, CVD, and ALD. In an alternative embodiment, gate dielectric layer 106 may include strontium oxynitride (SrON).

In another embodiment, buffer layer 104 comprises a first dielectric layer that may include strontium, oxygen, and nitrogen such as strontium oxynitride (SrON) and gate dielectric layer 106 comprises a second dielectric layer that may include strontium nitride. In an embodiment in which gate dielectric layer 106 comprises SrON, the buffer layer 104 may include a silicon oxide such as silicon dioxide (SiO2).

Figure 3:
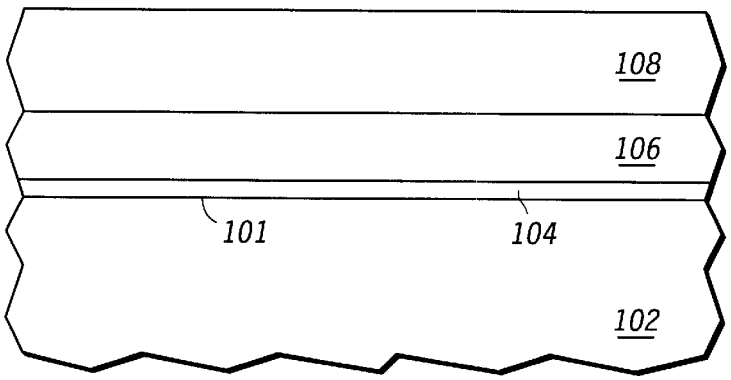
FIG. 3 illustrates a processing step subsequent to FIG. 2 in which a gate electrode layer has been formed over the gate dielectric layer.

Turning now to FIG. 3, a gate electrode layer 108 is formed over dielectric layer 106. The gate electrode layer 108 is a conductive material such as a metal or heavily doped polysilicon typically formed with a CVD or sputtering process. In one embodiment, a thickness of buffer layer 104 is in the range of approximately 1 to 5 nanometers, dielectric layer 106 has a thickness in the range of approximately 1 to 10 nanometers, and gate electrode layer 108 has a thickness in the range of approximately 100 to 200 nanometers. The effective oxide thickness (EOT) of the dielectric stack comprised of dielectric layer 106 and buffer layer 104 is preferably less than 3.0 nanometers, where EOT is defined as the thickness of a film divided by its dielectric constant.

One embodiment of the invention contemplates a capacitor including a first conductive plate and a second conductive plate displaced on either side of a capacitor dielectric. As depicted in FIG. 3, the first plate of a capacitor 107 comprises or is integrated with substrate 102, which is typically made conductive by doping with an implant, diffusion, or other suitable process as is well known in the field of semiconductor fabrication. In the embodiment depicted in FIG. 3, the gate electrode layer 108 serves as the second conductive plate and the capacitor dielectric comprises buffer layer 104 and dielectric layer 106. In this embodiment, it will be appreciated that the capacitor 107 integrates into a semiconductor fabrication process such that it is formed in conjunction with the formation of a transistor 110 (as depicted and described in greater detail below with respect to FIG. 3). In other embodiments, the first plate of capacitor 107 may comprise any conductive film formed above substrate 102 as part of the integrated circuit process.

Figure 4:
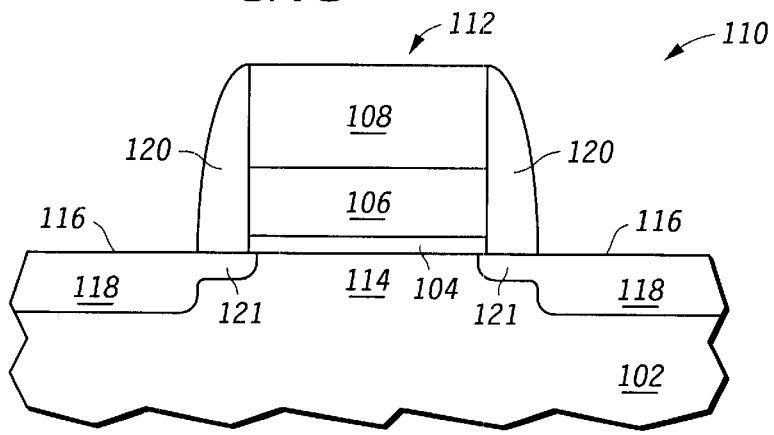
FIG. 4 illustrates a processing step subsequent to FIG. 3 in which a transistor has been formed.

Turning now to FIG. 4, subsequent processing of wafer 100 as depicted in FIG. 2 results in the formation of a transistor 110. A gate electrode 112 is formed by patterning and etching gate electrode layer 108 and gate dielectric layer 106. In the depicted embodiment, spacer structures 120 are formed on sidewalls of gate electrode 112. Source/drain structures 116 are formed in an upper portion of substrate 102 proximal to first surface 101. The lateral positioning of gate structure 112 over substrate 102 defines a channel region 114 of transistor 110 under gate electrode 212 and source/drain structures 116 are laterally displaced on either side of channel region 114. Thus, source/drain regions 116 are substantially laterally adjacent to gate electrode 112. In the depicted embodiment, source/drain regions 116 include an extension diffusion portion 121 formed by performing an extension implant prior to the formation of spacer formations 120 and a heavily doped diffusion portion 118 formed by performing a second source/drain implant after the formation of spacer structures 120. Thus, transistor 110 includes a substrate 102, a portion of the substrate proximal to first surface 101 comprising a semiconductor material. The transistor includes the buffer layer 104 and may include the dielectric layer 106 formed over first surface 101 wherein buffer layer 104 may comprise strontium nitride. Gate electrode 112 is located over the buffer layer 104 and source/drain regions 116 are located in the upper portion of substrate 102 substantially lateral adjacent to gate electrode 112 over a channel 114.

Figure 5:
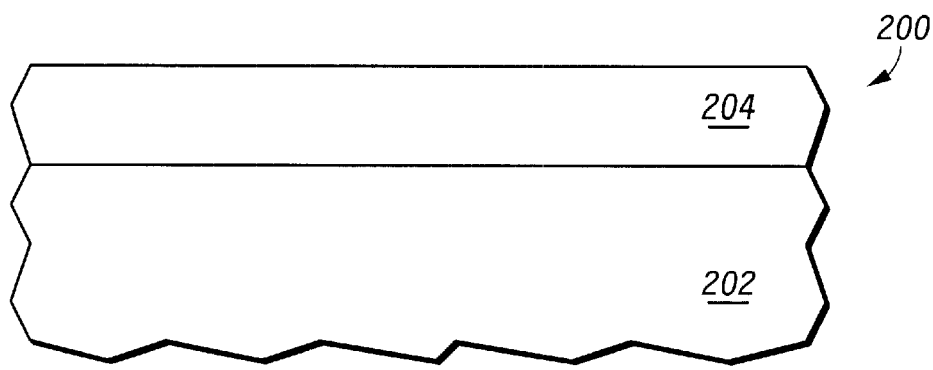
FIG. 5 illustrates a partial cross-sectional view of a semiconductor substrate on which a gate dielectric according to one embodiment of the invention has been deposited.
Figure 6:
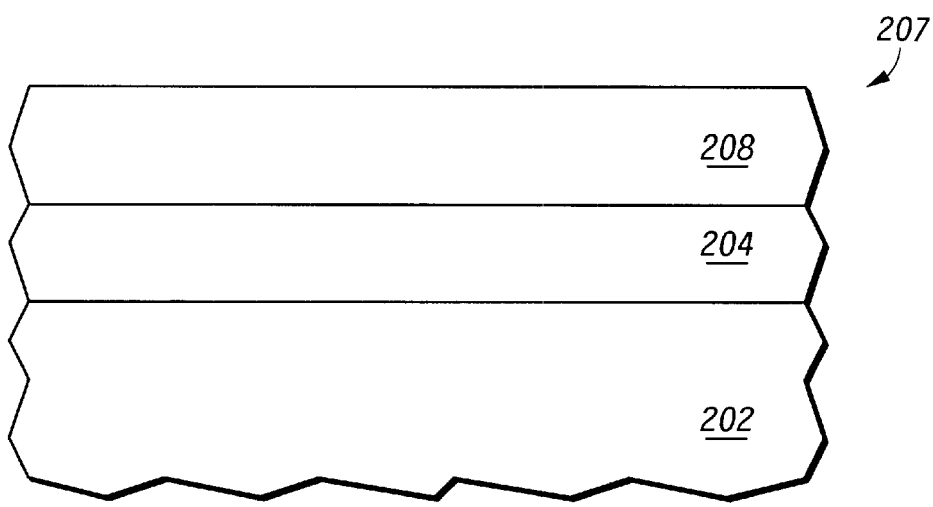
FIG. 6 illustrates a processing step subsequent to FIG. 5 in which a gate electrode material has been deposited over the gate dielectric layer.
Figure 7:
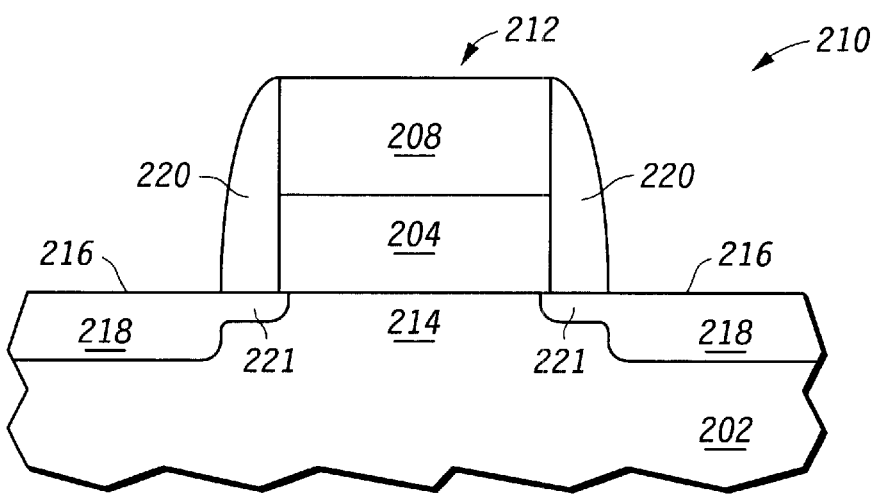
FIG. 7 illustrates a processing step subsequent to FIG. 6 in which a transistor has been formed in the semiconductor substrate.

Turning now to FIGS. 5 through 7, a process flow suitable for forming a capacitor 207 and a transistor 210 according to another embodiment of the invention are depicted. In FIG. 5, a strontium bearing dielectric layer 204 is formed over substrate 202. In one embodiment, strontium bearing dielectric layer 204 is a strontium nitride layer formed with a sputtering, CVD, or ALD deposition process. In another embodiment, strontium bearing dielectric layer 204 includes strontium, oxygen, and nitrogen, such as strontium oxynitride.

Turning now to FIG. 6, a gate electrode layer 208 is deposited over strontium bearing dielectric layer 204. The gate electrode layer 208 comprises a conductive material such as a metal or heavily doped polysilicon formed with a CVD or other suitable deposition process. The combination of substrate 202, strontium bearing dielectric layer 204, and gate electrode layer 208 form one embodiment of an integrated circuit capacitor 207. In this embodiment, substrate 202 comprises a first plate of capacitor 207 and gate electrode layer 208 comprises a second electrode of the capacitor 207. In other embodiments, capacitor 207 may be formed above substrate 202 by incorporating a strontium dielectric layer between a pair of conductive films.

Turning now to FIG. 7, further processing of wafer 200 results in the formation of a transistor 210 including a gate electrode 212 formed by appropriate patterning and etching of gate electrode layer 208 and gate dielectric 204. The lateral positioning of gate electrode 212 defines a channel region 214 and substrate 202. In the depicted embodiment, dielectric spacer structures 220 are formed on sidewalls of gate electrode 212. Source/drain structures 216 are formed laterally displaced on either side of channel region 214 using an extension implant prior to formation of spacer structures 220 to form extension implant regions 221 and a second implant after the formation of spacer structures 220 to form heavily doped source/drain regions 218.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A transistor device, comprising:
   a substrate having a semiconductor material on a first surface;
   a layer of strontium nitride over the first surface;
   a gate electrode over the layer of strontium nitride;
   a source and drain in the first surface substantially laterally adjacent to the gate electrode;
   a channel in the first surface under the gate electrode; and
   a dielectric layer between the layer of strontium nitride and the gate electrode;
   wherein the dielectric layer comprises strontium, titanium, and oxygen.

2. The transistor device of claim 1, wherein the dielectric layer and the layer of strontium nitride are epitaxial layers.

3. A transistor device, comprising:
   a substrate having a semiconductor material on a first surface;
   a layer of strontium nitride over the first surface;
   a gate electrode over the layer of strontium nitride;
   a dielectric layer between the layer of strontium nitride and the gate electrode a source and drain in the first surface substantially laterally adjacent to the gate electrode; and a channel in the first surface under the gate electrode;

wherein the layer of strontium nitride is formed by one of sputtering, CVD, and ALD: and wherein the dielectric layer comprises strontium, oxygen, and nitrogen formed by one of sputtering, CVD, and ALD.

4. The transistor device of claim 3, wherein the dielectric layer is strontium oxynitride.

5. A transistor device, comprising:

a substrate having a semiconductor material on a first surface;

a first dielectric layer comprising strontium, oxygen, and nitrogen over the first surface;

a second dielectric layer between the first surface and the first dielectric.

a gate electrode over the first dielectric layer;

a source and drain in the first surface substantially laterally adjacent to the gate electrode; and a channel under the gate electrode;

wherein the first dielectric layer is strontium oxynitride; and wherein the second dielectric layer comprises strontium nitride.

6. A transistor device, comprising:

a substrate having a semiconductor material on a first surface;

a first dielectric layer comprising strontium, oxygen, and nitrogen over the first surface;

a second dielectric layer between the first surface and the first dielectric.

a gate electrode over the first dielectric layer;

a source and drain in the first surface substantially laterally adjacent to the gate electrode; and a channel under the gate electrode;

wherein the first dielectric layer is strontium oxynitride; and wherein the second dielectric layer comprises silicon oxide.

7. An integrated circuit capacitor device, comprising:

a first conductive plate integrated with a semiconductor substrate;

a second conductive plate integrated with the semiconductor substrate; and a first dielectric layer comprising strontium and nitrogen between the first and second conductive plates, said first dielectric layer comprising a layer of strontium nitride and a layer of strontium oxynitride.

8. An integrated circuit capacitor device, comprising:

a first conductive plate integrated with a semiconductor substrate;

a second conductive plate integrated with the semiconductor substrate; and a first dielectric layer comprising strontium and nitrogen between the first and second conductive plates;

wherein the first dielectric layer comprises strontium nitride; and wherein the first dielectric layer further comprises a layer of dielectric material different from strontium nitride.

* * * * *